United States Patent
Minamio et al.

(10) Patent No.: US 7,154,156 B2
(45) Date of Patent: Dec. 26, 2006

(54) SOLID-STATE IMAGING DEVICE AND METHOD FOR PRODUCING THE SAME

(75) Inventors: Masanori Minamio, Takatsuki (JP); Mutsuo Tsuji, Izumiotsu (JP); Kouichi Yamauchi, Takatsuki (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 300 days.

(21) Appl. No.: 10/676,135

(22) Filed: Sep. 30, 2003

(65) Prior Publication Data
US 2004/0211986 A1    Oct. 28, 2004

(30) Foreign Application Priority Data
Apr. 28, 2003    (JP)    ............... 2003-123841

(51) Int. Cl.
  H01L 27/14    (2006.01)
  H01L 31/00    (2006.01)
(52) U.S. Cl. .............. 257/431; 257/432; 257/433; 257/434; 257/460; 257/462
(58) Field of Classification Search ......... 257/59, 257/72, 431–434, 460, 462
See application file for complete search history.

(56) References Cited
U.S. PATENT DOCUMENTS

| | | |
|---|---|---|
| 5,223,746 A | 6/1993 | Abe et al. |
| 5,748,448 A | 5/1998 | Hokari |
| 5,952,714 A | 9/1999 | Sano et al. |
| 2001/0052640 A1 | 12/2001 | Sekimoto |
| 2004/0056365 A1* | 3/2004 | Kinsman .............. 257/778 |

FOREIGN PATENT DOCUMENTS

| | | |
|---|---|---|
| EP | 1 237 202 A1 | 9/2002 |
| JP | 5-243538 | 9/1993 |
| JP | 8-227984 | 9/1996 |
| JP | 2001-298050 | 10/2001 |
| KR | 2001-0089203 | 9/2001 |
| WO | 97/05660 | 2/1997 |

* cited by examiner

*Primary Examiner*—Thien F. Tran
(74) *Attorney, Agent, or Firm*—Hamre, Schumann, Mueller & Larson, P.C.

(57) ABSTRACT

A solid-state imaging device includes: a base made of an insulation material and having a frame form in planar shape with an aperture formed at an inner region; a plurality of wirings provided on one surface of the base and extending toward an outer periphery of the base from a region along the aperture; and an imaging element mounted on the surface of the base with wirings provided thereon so that a light-receptive region of the imaging element faces the aperture. An end portion on the aperture side of each of the plurality of wirings forms an internal terminal portion and an end portion on the outer peripheral side of each of the plurality of wirings forms an external terminal portion, the internal terminal portion of the wiring being connected electrically with an electrode of the imaging element. The wirings are made of thin metal plate leads, the base is made up of a resin molded member in which the thin metal plate leads are embedded, and at least a part of a side edge face of the thin metal plate leads is embedded in the base. The rigidity of the base is enhanced by the thin metal plate leads, thus reducing a curl and a warp of the base.

10 Claims, 4 Drawing Sheets

SOLID-STATE IMAGING DEVICE AND METHOD FOR PRODUCING THE SAME

BACKGROUND OF THE INVENTION

1. Field of the Invention

The present invention relates to a solid-state imaging device configured by mounting an imaging element such as a CCD on a base and a method for producing the same.

2. Related Background Art

Solid-state imaging devices are used widely for video cameras and still cameras, and are provided in a form of a package in which an imaging element such as a CCD is mounted on a base made of an insulating material and a light-receptive region is covered with a transparent plate. In order to miniaturize the device, the imaging element is mounted on the base while keeping a bare chip state (for example, see JP 2000-58805 A). Such a conventional example of the solid-state imaging devices will be described below with reference to FIG. 7.

A base 31 in FIG. 7 is made of ceramic or a plastic resin and has a frame form in planar shape having an aperture 32 in its center portion. A bottom face of the base 31 is recessed at a region along a periphery of the aperture 32 so as to form a recess 33. The bottom face of the base 31 is provided with a wiring 34 made of a gold plate layer, which extends from the vicinity of the aperture 32 to a peripheral end face of the base 31. On the face of the recess 33 with the wiring 34 formed thereon, an imaging element 35 configured with a CCD and the like is mounted, which is connected with the wiring 34. The imaging element 35 is disposed so that its light-receptive region 35a faces the aperture 32. On a top face of the base 31, a transparent plate 36 made of glass is attached so as to cover the aperture 32. The surroundings of an end portion of the imaging element 35 are filled with a sealing resin 37 so as to hermetically seal a gap between the end portion of the imaging element 35 and the base 31. In this way, the light-receptive region 35a is disposed within a closed space formed with the aperture 32.

On the same surface of the imaging element 35 as the light-receptive region 35a, an electrode pad (not illustrated) connected with a circuit for the light-receptive region 35a is disposed, and a bump (protrusion electrode) 38 is provided on the electrode pad. An end portion of the wiring 34 adjacent to the aperture 32 forms an internal terminal portion, which is connected with the electrode pad for the imaging element 35 via the bump 38.

This solid-state imaging device is to be mounted on a circuit board, in a position as shown in the drawing, with a transparent plate 36 side facing upward. A portion of the wiring 34 that is disposed on the bottom face of the outer peripheral area (the area outside the recess 33) of the base 31 forms an external terminal portion, which is used for the connection with an electrode on the circuit board. A lens barrel (not illustrated) with an imaging optical system incorporated therein is provided above the transparent plate 36, where a relative positional relationship with the photoreceptive region 35a is set with predetermined accuracy. By means of the imaging optical system incorporated in the lens barrel, light from an object to be imaged is collected onto the light-receptive region 35a so as to effect photoelectric conversion.

In addition, as well as the structure of the base 31 in the configuration shown in FIG. 7, there is a known example of a solid-state imaging device employing a base having a flat planar shape as the whole without the recess 33 on the face for mounting the imaging element 35 (for example, see JP 2002-43554 A). In such a case, an external terminal portion disposed at a peripheral end portion of a base is connected with an electrode on a circuit board by means of a solder ball and the like having a large diameter. The solder ball functions so as to adjust an interval between the bottom face of the imaging element 35 and a face of the circuit board as well.

According to the configuration of the above-described conventional solid-state imaging devices, however, it is difficult to obtain a sufficient flatness of the base 31. That is to say, since the base 31 has a frame form having the aperture 32, there is a tendency to generate a curl and a warp in its cross-sectional shape. When the flatness of the face of the recess 33 to which the imaging element 35 is to be mounted is not sufficient, then the position of the imaging element 35 becomes unstable, resulting in the lens barrel not being aligned accurately with respect to the light-receptive region 35a.

Furthermore, in the conventional examples, the wiring is formed by plating. In this respect, a process for applying the plating to the base 31 is complicated, and the process tends to generate a variation in dimensional accuracy of the formed wiring 34 and requires high cost.

SUMMARY OF THE INVENTION

Therefore, with the foregoing in mind, it is an object of the present invention to provide a solid-state imaging device whose base for mounting an imaging element has a practically sufficient flatness. In addition, it is another object of the present invention to provide a solid-state imaging device which is provided with wirings with a reduced variation in dimensional accuracy and at a low cost. Furthermore, it is still another object of the present invention to provide a manufacturing method that is suitable for producing such a solid-state imaging device.

A solid-state imaging device of the present invention includes: a base made of an insulation material and having a frame form in planar shape with an aperture formed at an inner region; a plurality of wirings provided on one surface of the base and extending toward an outer periphery of the base from a region along the aperture; and an imaging element mounted on the surface of the base with the plurality of wirings provided thereon so that a light-receptive region of the imaging element faces the aperture. An end portion on the aperture side of each of the plurality of wirings forms an internal terminal portion and an end portion on the outer peripheral side of each of the plurality of wirings forms an external terminal portion, the internal terminal portion of the wiring being connected electrically with an electrode of the imaging element. In order to cope with the above-stated problem, the plurality of wirings are made of thin metal plate leads, the base is made up of a resin molded member in which the thin metal plate leads are embedded, and at least a part of a side edge face of the thin metal plate leads is embedded in the base.

According to the present invention, a method for producing a solid-state imaging device having the above-described configuration includes: using a pair of molds for forming cavities for molding the base, together with a lead frame having thin metal plate leads for forming the plurality of wirings and a reinforcing plate portion having a shape corresponding to a shape of the aperture of the base which is connected to the thin metal plate leads in a semi-disconnected state at a boundary portion therebetween; placing the lead frame between the pair of molds so that the thin metal plate leads are positioned in the cavities formed with the pair of molds and so that the reinforcing plate portion is positioned at a portion where the aperture is to be formed; pouring a sealing resin in the cavities, followed by curing the sealing resin; taking a resin molded member formed in a shape of the base, in which the thin metal plate leads are embedded, out of the pair of molds; separating the reinforcing plate portion from the thin metal plate leads so as to obtain the base, and mounting the imaging element on a face of the base with the plurality of wirings provided thereon.

DETAILED DESCRIPTION OF THE INVENTION

Figure 1:
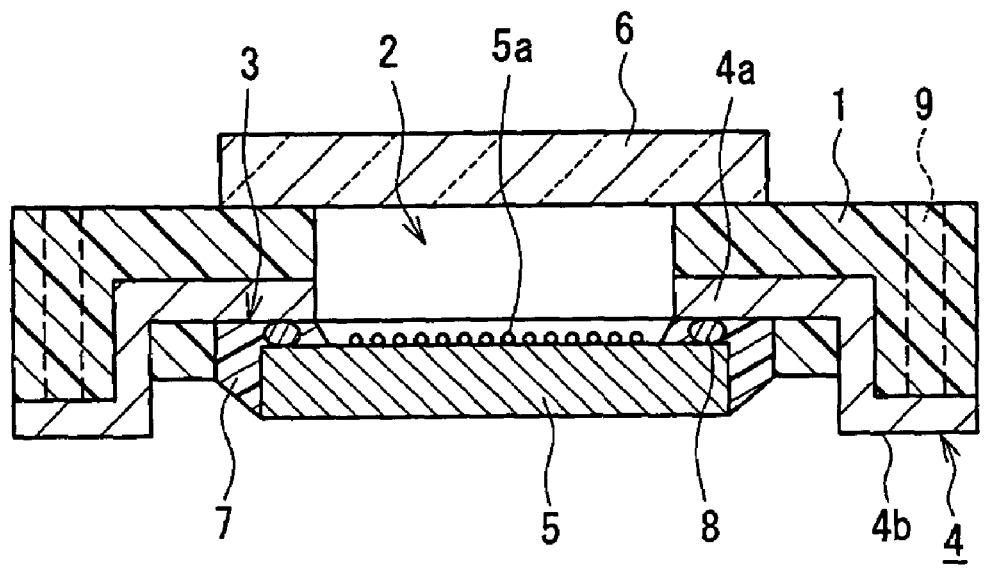
FIG. 1 is a cross-sectional view of a solid-state imaging device in Embodiment 1.

In a solid-state imaging device of the present invention, wirings provided on a base for mounting an imaging element are made of thin metal plate leads, and the base is made up of a resin molded member in which the thin metal plate leads are embedded. At least a part of a side edge face of the thin metal plate leads is embedded in the base, which increases the rigidity of the base, so as to suppress a curl and a warp of the base. As a result, a practically sufficient flatness of the base can be obtained. Moreover, wirings provided with a reduced variation in dimensional accuracy can be obtained at low cost.

This solid-state imaging device may have a configuration in which the surface of the base with the plurality of wirings provided thereon has a recess at a region along the aperture so as to be recessed relative to a region outside the recess, and on a face of the recess, the imaging element is mounted. Preferably, a surface of a portion of the thin metal plate leads residing between the internal terminal portion and the external terminal portion is embedded in the base.

The above-described solid-state imaging device may have a configuration in which a thickness of the base is substantially uniform, and a solder ball is provided on the external terminal portion of each of the plurality of wirings.

The above-described solid-state imaging device may have a configuration in which at least one of the internal terminal portion and the external terminal portion of the thin metal plate leads protrudes from a surface of the base.

Preferably, the base includes a plurality of positioning reference holes that are formed in a thickness direction of the base, and the imaging element is arranged so as to have a predetermined planar positional relationship with respective to the plurality of positioning reference holes. The plurality of positioning reference holes may be arranged respectively at asymmetrical positions in the planar shape of the base. This configuration allows the orientation of the base to be recognized. Alternatively, diameters of the plurality of positioning reference holes may be different from one another. In addition, preferably, the plurality of positioning reference holes penetrate through the base in the thickness direction of the base, wherein a diameter of the plurality of positioning reference holes on an imaging element mounting side is smaller than a diameter of the same on a rear face side.

A method for producing a solid-state imaging element of the present invention is characterized by the configuration of a lead frame which is used in a process for resin-molding of the base. That is, the lead frame has thin metal plate leads for forming wirings and a reinforcing plate portion having a shape corresponding to a shape of an aperture of a base which is coupled to the thin metal plate leads in a semi-disconnected state at a boundary portion therebetween. After molding, the reinforcing plate portion is separated from the thin metal plate leads. The semi-disconnected state refers to a state in which a thin metal plate is substantially cut at a boundary between the respective regions, with a small thickness being left uncut and the connections between the coupled portions are kept with a weak force such that the application of a small force separates the portions easily. The presence of the reinforcing plate portion during the molding process prevents the formation of a hollow between upper and lower molds at the time of molding, thus suppressing the generation of a curl and a warp of the base.

In this method, preferably, a recess for forming the cavities is formed in one of the pair of molds, and a deflashing sheet is interposed between the other mold and the lead frame when molding the base. The presence of the reinforcing plate portion secures the fixing of the deflashing sheet, so that an effect for suppressing the generation of a flash can be obtained sufficiently.

The following specifically describes embodiments of the present invention, with reference to the drawings.

Embodiment 1

A solid-state imaging device of Embodiment 1 will be described below, with reference to FIGS. 1 and 2. A base 1 is made of a plastic resin such as an epoxy resin and has a rectangular frame form in planar shape having a rectangular aperture 2 in its center portion. A bottom face of the base 1 is recessed at a region along a periphery of the aperture 2 so as to form a rectangular recess 3 that surrounds the aperture 2. The bottom face of the base 1 is provided with a plurality of wirings 4 made of thin metal plate leads, which extend from the vicinity of the aperture 2 to an outer peripheral end face of the base 1. As the thin metal plate leads, Cu alloy, 42 alloy (Fe—Ni 42 alloy) and the like, which are similar to the materials used for a normal lead frame, are used. Thickness thereof usually ranges approximately from 2 to 3 µm.

On the surface of the recess 3 with the wirings 4 formed thereon, an imaging element 5 such as a CCD and the like formed on a Si base is mounted, which is connected with the wirings 4. The imaging element 5 is mounted so that its light-receptive region 5a faces the aperture 2. On a top face of the base 1, a transparent plate 6 made of glass is attached so as to cover the aperture 2. The peripheral portion of the imaging element 5 is filled with a sealing resin 7 made of an epoxy resin and the like so as to hermetically seal a gap between the end portion of the imaging element 5 and the base 1. In this way, the light-receptive region 5a is disposed within a closed space formed with the aperture 2.

On the same surface of the imaging element 5 as the light-receptive region 5a, an electrode pad (not illustrated) connected with a circuit of the light-receptive region 5a is disposed, and a bump 8 made of Au is provided on the electrode pad. An end portion of each of the wirings 4 adjacent to the aperture 2 forms an internal terminal portion 4a, which is connected with the electrode pad of the imaging element 5 via the bump 8. A portion of each wiring 4 that is disposed on the bottom face of the outer peripheral end portion (the portion outside the recess 3) of the base 1 forms an external terminal portion 4b, which is used for the connection with an electrode on a circuit board.

Outside the recess 3 of the base 1, a plurality of positioning reference holes 9 are formed. The imaging element 5 is packaged with predetermined positional accuracy with respect to the positioning reference holes 9. Therefore, when the solid-state imaging device is mounted on the circuit board and a lens barrel with an imaging optical system incorporated therein is provided above the transparent plate 6, the planar position of the lens barrel can be determined accurately with respect to the light-receptive region 5a. It is preferable that, as shown in the drawing, the plurality of positioning reference holes 9 are arranged asymmetrically in the planar geometry of the base 1. This arrangement also can be utilized for recognizing the orientation of the base 1. Alternatively, the arrangement of a plurality of positioning reference holes having different diameters can provide the same effect.

The base 1 is shaped so that the plurality of thin metal plate leads that constitute the respective wirings 4 are embedded therein. Referring to FIGS. 2A and 2B, the configuration of the base 1 with the thin metal plate leads constituting the wirings 4 embedded therein will be described below. FIG. 2A is a plan view showing the base 1 in a state before the packaging of the imaging element 5, when viewing it from below in FIG. 1. FIG. 2B is a side view of the same. As shown in FIG. 2A, the wirings 4 include the internal terminal portion 4a, the external terminal portion 4b and an intermediate portion 4c residing therebetween. The intermediate portion 4c is embedded in the resin that forms the base 1. In addition, as shown in FIG. 2B, while the surfaces of the internal terminal portion 4a and the external terminal portion 4b are exposed, the side edge faces thereof are embedded in the base 1. The entire side edge faces are not necessarily embedded as shown in the drawing. The degree of the embedding can be adjusted depending on the other conditions, as long as the degree is sufficient for obtaining the functions and the effects described later. That is to say, unlike FIG. 2B, a portion of the side edge face of the external terminal portion 4b or the internal terminal portion 4a may be exposed so that the external terminal portion 4b or the internal terminal portion 4a protrudes from the surface of the base 1.

Since the wirings 4 formed with the thin metal plate leads are embedded in the base 1 as described above, the frame form of the base 1 is reinforced by the thin metal plate leads, thus obtaining an effect of maintaining the flatness of the top and bottom surfaces of the base. That is to say, while the base 1 having the aperture 2 tends to generate a curl and a warp, the rigidity functioning against the internal stress generating the curl and the warp is increased by embedding the thin metal plate leads therein, thus substantially maintaining the flatness of the frame form for a practical purpose. As a result, the position of the imaging element 5 mounted on the face of the base 1 becomes stable, so that the lens barrel easily can be aligned with respect to the light-receptive region 5a with accuracy.

Furthermore, the thin metal plate leads can be manufactured with accuracy and with a reduced variation of dimension, and moreover at a low cost by a process of cutting a thin metal plate.

Figure 7:
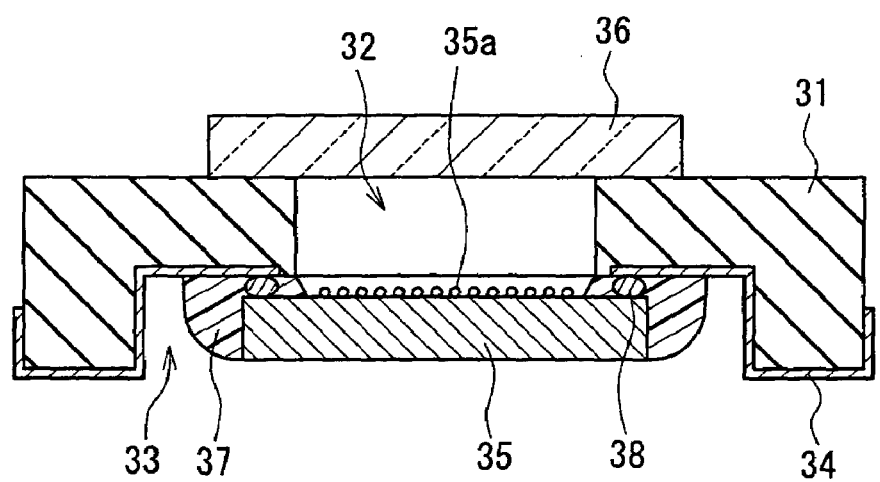
FIG. 7 is a cross-sectional view of a solid-state imaging device as a conventional example.

Moreover, the use of the thin metal plate leads can increase the thickness of the wirings 4 sufficiently as compared with the case of the use of plated metal layer. Therefore, as a result of the exposure of the end faces of the wirings 4 from the outer end face of the base 1 as shown in FIG. 1, the fillet of solder can be formed sufficiently on the end faces of the wirings 4 when the electrode on the circuit board and the wirings 4 are connected with the solder. As a result, sufficient bonding strength with the solder can be obtained. Consequently, there is no need to form the wirings so as to extend over the peripheral end face as in the conventional example of FIG. 7, thus making the manufacturing process simpler.

In addition, the thin metal plate leads constituting the wirings 4 are embedded at the intermediate portion 4c in the resin forming the base 1 as described above, and therefore the influence of the reflection and the leakage of light from the thin metal plate lead surfaces on the light-receptive region 5a can be reduced.

Embodiment 2

Figure 3:
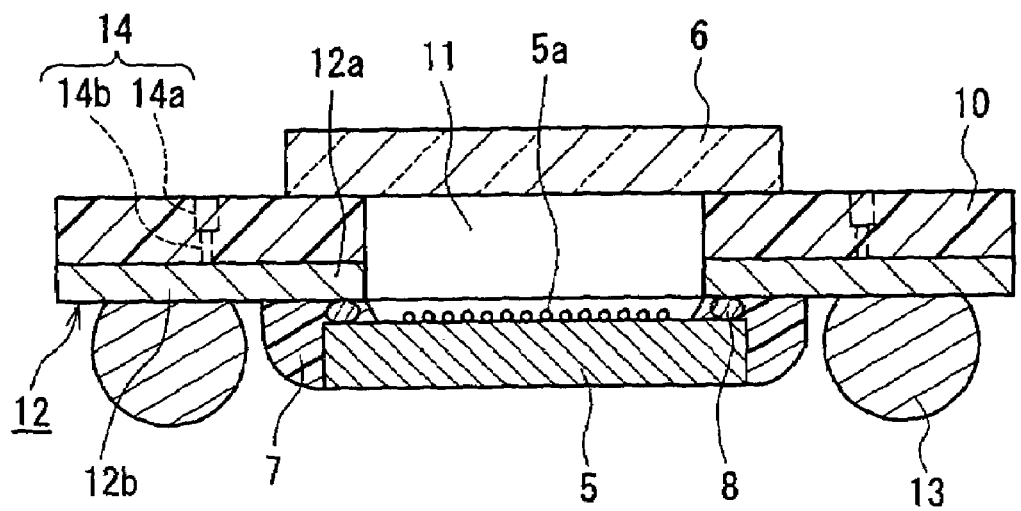
FIG. 3 is a cross-sectional view of a solid-state imaging device in Embodiment 2.

A solid-state imaging device according to Embodiment 2 will be described below, with reference to FIGS. 3 and 4. The same reference numerals will be assigned to the same elements as in Embodiment 1 so as to simplify their explanations. This embodiment is different from Embodiment 1 in the configuration of a base 10. The base 10 with a rectangular planar shape has a flat plate form having a uniform thickness as the whole in its cross-sectional shape, and does not have a recess as in Embodiment 1. An aperture 11 is formed in the central portion of the plate form base 10, and an imaging element 5 is mounted thereon with its light-receptive region 5a facing the aperture 11.

On the bottom face of the base 10, a plurality of wirings 12 made of thin metal plate leads are disposed, which extend from the edge of the aperture 11 to an outer peripheral end face of the base 10. On an electrode pad (not illustrated) disposed on the same surface of the imaging element 5 as the light-receptive region 5a, a bump 8 is disposed, which is connected with an internal terminal portion 12a at an end portion of each wiring 12 on the side of the aperture 11. An end portion of each wiring 12 disposed on the bottom face of the outer peripheral region of the base 10 forms an external terminal portion 12b. On the external terminal portion 12b of the each wiring 12, a solder ball 13 is provided, which is utilized for the connection with an electrode on a circuit board. The solder ball 13 also has the function of keeping the base 10 at a suitable height from the circuit board face.

Figures 4A, 4B:
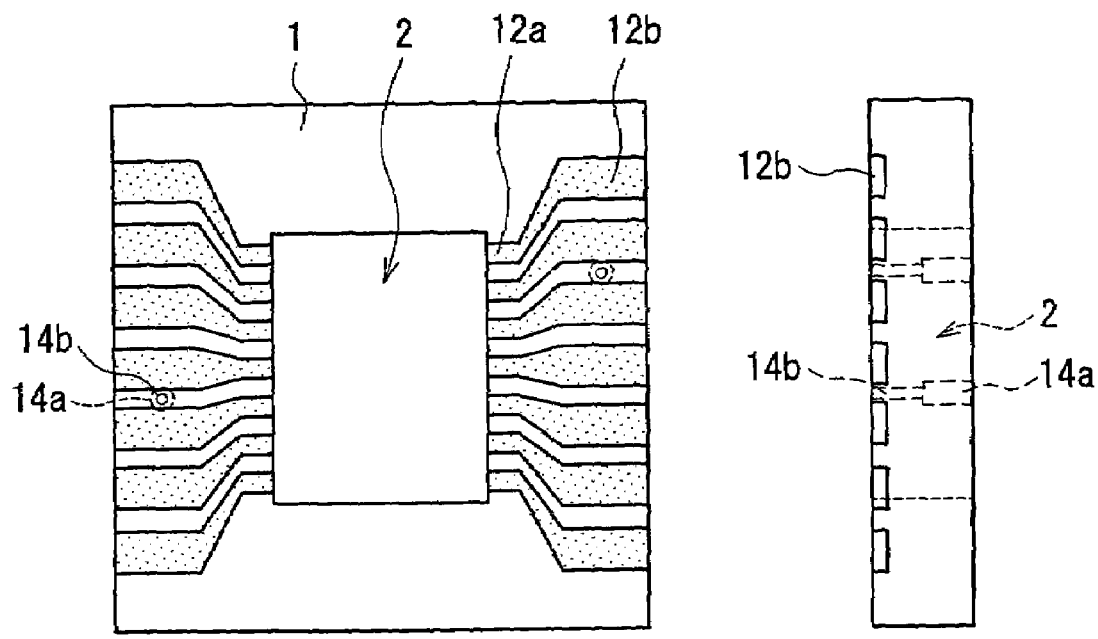
FIG. 4A is a plan view of a base composing the solid-state imaging device of FIG. 3, when viewed from the rear side.
FIG. 4B is a side view of the same.

In this solid-state imaging device also, the base 10 is formed by embedding the thin metal plate leads constituting the wirings 12 therein. As shown in FIG. 4A, the entire bottom surface of the wirings 12 is exposed. Meanwhile, as shown in FIG. 4B, the side edge face of the wirings 12 is embedded in a resin constituting the base 10. Therefore, the frame form of the base 10 is reinforced by the thin metal plate leads so as to maintain the flatness of the top and bottom surfaces of the base favorably. That is to say, the rigidity functioning against the internal stress generating a curl and a warp is increased by embedding the thin metal plate leads therein, thus maintaining the flatness of the frame form.

By making the base 10 the flat plate form as in this embodiment, the following advantages can be obtained, in addition to the easiness of the resin molding. That is to say, if a warp of the base 10 and the like cannot be eliminated completely by embedding the wirings 12 therein, then the warp and the like can be corrected after the molding. For instance, after the resin molding and before packaging the imaging element 5, such deformation can be corrected easily by sandwiching the top and the bottom faces of the base 10 between flat planes, followed by the application of a heat thereto.

A positioning reference hole 14 provided in the base 10 includes a large diameter portion 14a on a top face side and a small diameter portion 14b on a bottom face side, which are formed concentrically. As shown in FIG. 4A, the positioning reference hole 14 is arranged so as not to overlap the wiring 12, and the small diameter portion 14b is exposed from the rear face. In manufacturing, the position of this small diameter portion 14b is detected by an image recognition apparatus and the like, and then the position of the imaging element 5 can be determined with reference to the position of the small diameter portion 14b at the time of packaging the imaging element 5. In addition, by determining the planar position of a lens barrel with reference to the large diameter portion 14a, the relative position of the imaging element 5 and the lens barrel can be determined with accuracy. The position of the lens barrel can be determined easily, for example, by fitting a shaft provided below the lens barrel into the large diameter portion 14a.

Embodiment 3

A method for producing the solid-state imaging device having the above-described configurations will be described below, with reference to FIGS. 5 and 6. In the following description, a case where the manufacturing method of this embodiment is applied for manufacturing the solid-state imaging device having the configuration of FIGS. 1 and 2, will be exemplified. FIGS. 5A to 5C show only a process of molding a base. FIG. 6 is a plan view of the base at a stage of FIG. 5B.

Figure 5A:
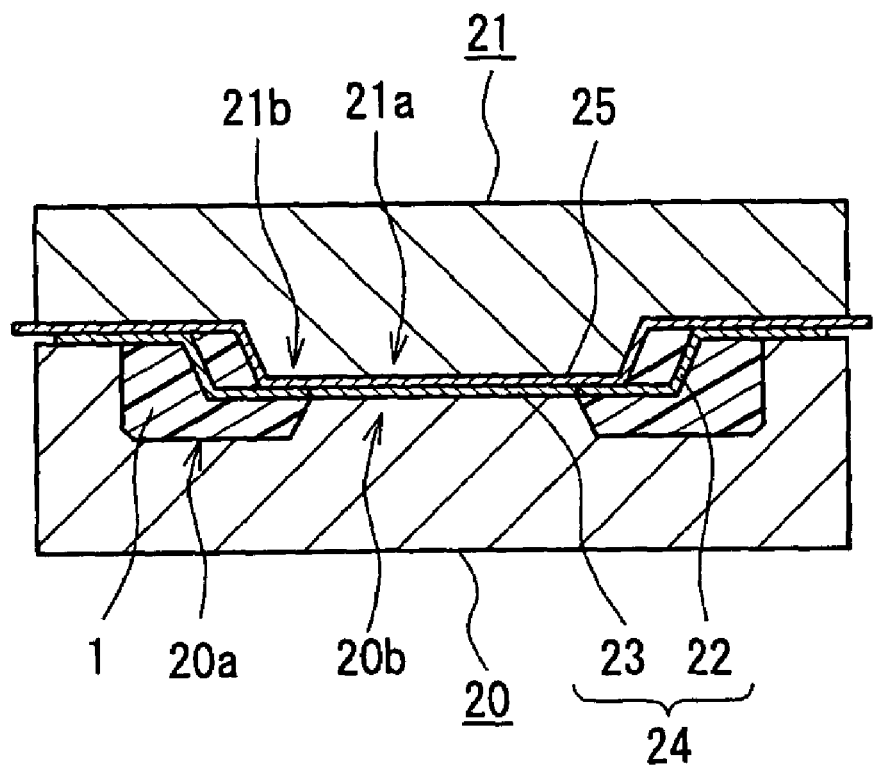
FIGS. 5A to C are cross-sectional views showing a method for producing a solid-state imaging device in Embodiment 3.
Figure 5B:
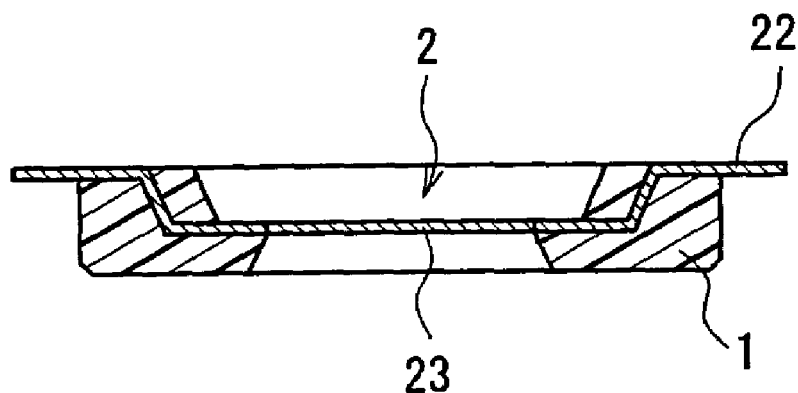
Figure 5C:
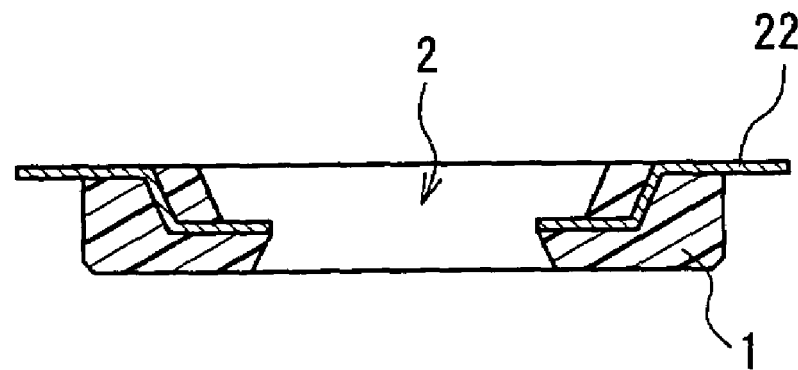
Figure 6:
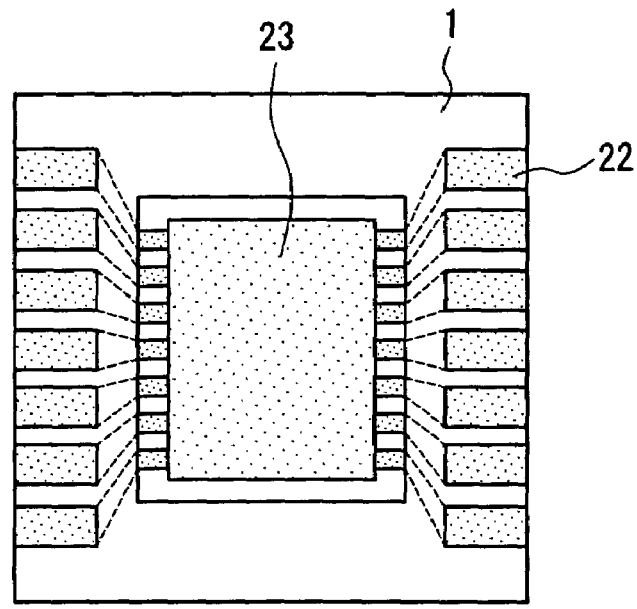
FIG. 6 is a plan view of the base at a stage of FIG. 5B.

Firstly, a lower mold 20 and an upper mold 21 shown in FIG. 5A are prepared as molds for resin molding. The lower mold 21 has a recess 20a formed therein. This recess is filled with a resin so as to mold the base 1 of FIG. 1. Note here that FIG. 5A shows the base 1 being molded by turning the state of FIG. 1 upside down. In the central portion of the lower mold 20, a lower protrusion 20b also is formed. The upper mold 21 has an upper protrusion 21a formed in its central portion. When the lower mold 20 and the upper mold 21 are combined, the lower protrusion 20b and the upper protrusion 21a are opposed to each other so as to form a region that is not filled with the resin. Thereby, after the molding, the base 1 has the aperture 2 shown in FIG. 1. The lower face of the upper protrusion 21a has shoulder portions 21b, each protruding outside beyond an upper face of the lower protrusion 20b, and these shoulder portions 21b allow faces of the recess 3 of FIG. 1 to be formed.

Between the lower mold 20 and the upper mold 21, a deflashing sheet 25 and a lead frame 24 including a thin metal plate lead 22 (corresponding to the wiring 4) and a reinforcing plate 23 are sandwiched. The use of the deflashing sheet 25 reduces the generation of flash during the resin molding, and also secures a stand-off. The reinforcing plate 23, as shown in FIG. 6 has the same planar shape as that of the aperture 2 of the base 1. The thin metal plate lead 22 and the reinforcing plate 23 are formed with one thin metal plate, and the border between the thin metal plate lead 22 and the reinforcing plate 23 is processed in a semi-disconnected state. The deflashing sheet 25 is used for avoiding the generation of a flash at an end portion of the molded resin.

As the process for molding, firstly, in a state shown in FIG. 5A, a resin is poured into cavities formed with the lower mold 20 and the upper mold 21, followed by curing of the resin so as to form the base 1 in which the thin metal plate lead 22 is embedded. Next, the lower mold 20 and the upper mold 21 are detached from one another, and, as shown in FIG. 5B and FIG. 6, a resin molded member shaped in the form of the base 1 with the thin metal plate lead 22 embedded is taken out. Finally, the reinforcing plate 23 is separated so as to obtain the base 1 as shown in FIG. 5C.

Figures 2A, 2B:
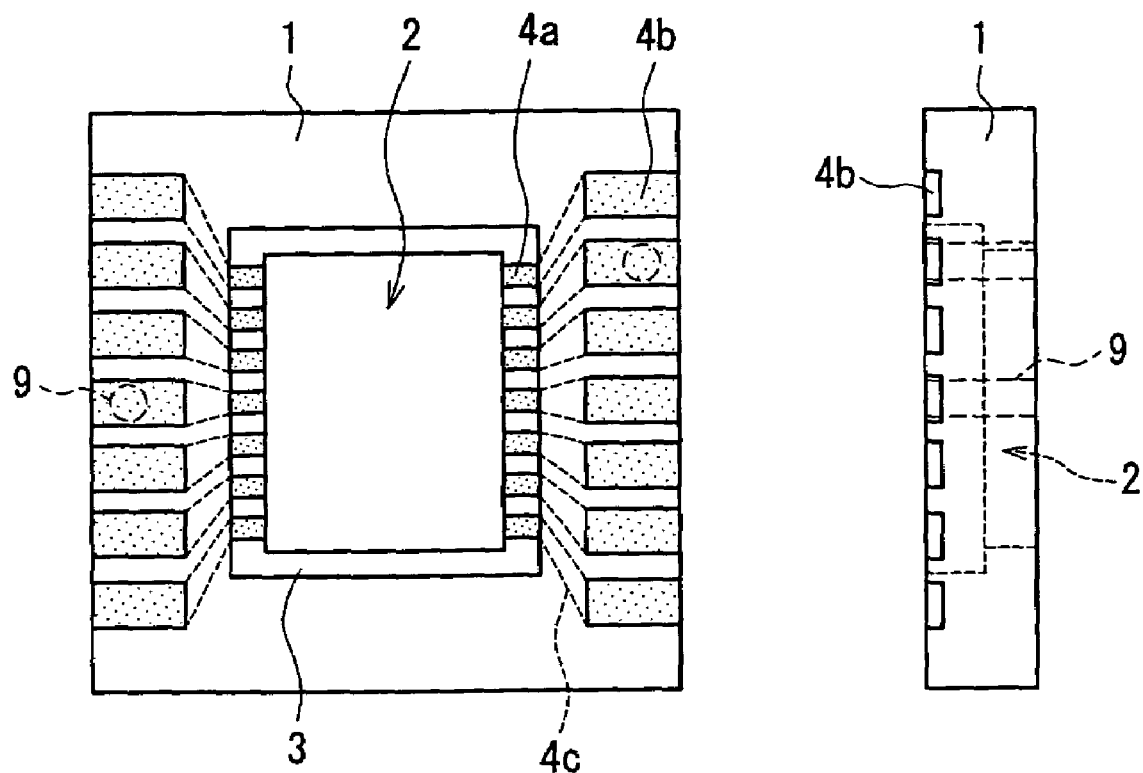
FIG. 2A is a plan view of a base composing the solid-state imaging device of FIG. 1, when viewed from the rear side.
FIG. 2B is a side view of the same.

The imaging element 5 is packaged onto this base 1, as shown in FIG. 1, and then the transparent plate 6 is attached thereto so as to complete the solid-state imaging device.

In the above-described molding process, the presence of the reinforcing plate 23 reduces the generation of a curl and a warp of the base 1. In other words, in the absence of the reinforcing plate 23, a hollow would be formed during the molding at a region between the lower mold 20 and the upper mold 21, which corresponds to a portion of the aperture 2. The presence of the hollow causes the generation of a curl and a warp of the base 1 after the molding. On the contrary, the presence of the reinforcing plate 23 allows the hollow not to be formed during the molding, thus suppressing the generation of a curl and a warp of the base 1. In addition, when the hollow is formed during the molding because of the absence of the reinforcing plate 23, the deflashing sheet 25 cannot be fixed sufficiently in the molds, which increases a tendency toward the generation of a flash during the resin molding. On the contrary, the presence of the reinforcing plate 23 allows the deflashing sheet 25 to be sandwiched flatly between the lower mold 20 and the upper mold 21, thus reducing the generation of a flash of the resin.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A solid-state imaging device, comprising:
   a base made of an insulation material and having a frame form in planar shape with an aperture farmed at an inner region;
   a plurality of wirings provided on one surface of the base and extending toward an outer periphery of the base from a region along the aperture; and
   an imaging element mounted onto surface of the base with the plurality of wirings provided thereon so that a light-receptive region of the imaging element faces the aperture,
   wherein an end portion on the aperture side of each of the plurality of wirings forms an internal terminal portion and an end portion on the outer peripheral side of each of the plurality of wirings forms an external terminal portion, the internal terminal portion of the wiring being connected elelectrically with an electrode of the imaging element, and
   wherein the plurality of wirings are made of thin metal plate leads, the base is made up of a resin molded member, and an upper surface and at least a part in a thickness direction of a side edge face extending from the internal terminal portion to the external terminal portion of the thin metal plate leads are embedded in the base, with a bottom surface of the external terminal portion exposed from the bottom surface of the base.

2. The solid-state imaging device according to claim 1, wherein a thickness of the base is substantially uniform, and
a solder ball is provided on the external terminal portion of each of the plurality of wirings.

3. The solid-state imaging device according to claim 1, wherein at least one of the internal terminal portion and the external terminal portion of the thin metal plate leads protrudes from a surface of the base.

4. The solid-state imaging device according to claim 1, wherein the entire side edge face of the thin metal plate leads is embedded in the base, and the entire surface of the thin metal plate leads is exposed.

5. The solid-stare imaging device according to claim 1, wherein the surface of the base with the plurality of wirings provided thereon has a recess at a region along the aperture so as to be recessed relative to a region outside the recess, and
on a face of the recess, the imaging element is mounted.

6. The solid-state imaging device according to claim 5, wherein a surface of a portion of the thin metal plate leads residing between the internal terminal portion and the external terminal portion is embedded in the base.

7. The solid-state imaging device according to claim 1, wherein the base comprises a plurality of positioning reference holes that are formed in a thickness direction of the base, and
the imaging element is arranged so as to have a predetermined planar positional relationship with respective to the plurality of positioning reference holes.

8. The solid-state imaging device according to claim 7, wherein the plurality of positioning reference holes are arranged respectively at asymmetrical positions in the planar shape of the base.

9. The solid-state imaging device according to claim 7, wherein dimensions of the plurality of positioning reference holes are different from one another.

10. The solid-state imaging device according to claim 7, wherein the plurality of positioning reference holes penetrate through the base in the thickness direction of the base, and a diameter of the plurality of positioning reference holes on an imaging element mounting side is smaller than a diameter of the same on a rear face side.

* * * * *